(12) United States Patent
Hsu et al.

(10) Patent No.: US 9,361,844 B2
(45) Date of Patent: Jun. 7, 2016

(54) DOUBLE SIDED SINGLE DRIVE GATE DRIVER WITH REDUCED DARK SPOTS

(71) Applicant: AU Optronics Corporation, Hsin-Chu (TW)

(72) Inventors: Wei-Chun Hsu, Hsin-Chu (TW); Yu-Hsin Ting, Hsin-Chu (TW); Chung-Lin Fu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 81 days.

(21) Appl. No.: 14/459,796

(22) Filed: Aug. 14, 2014

(65) Prior Publication Data

US 2015/0161958 A1    Jun. 11, 2015

(30) Foreign Application Priority Data

Dec. 5, 2013    (TW) .............................. 102144600 A

(51) Int. Cl.
*G09G 3/38*    (2006.01)
*G11C 19/28*    (2006.01)
*G09G 3/36*    (2006.01)

(52) U.S. Cl.
CPC .............. *G09G 3/3674* (2013.01); *G11C 19/28* (2013.01); *G09G 2310/0281* (2013.01); *G09G 2310/0286* (2013.01); *G09G 2310/08* (2013.01)

(58) Field of Classification Search
CPC .............. G09G 3/3674; G09G 3/3677; G09G 2310/0281–2310/0287; G09G 2310/08; G11C 19/28
See application file for complete search history.

(56) References Cited

U.S. PATENT DOCUMENTS

| 2002/0024511 | A1 | 2/2002 | Ozawa | |
| 2005/0201508 | A1* | 9/2005 | Shin | G09G 3/3677 377/10 |
| 2006/0210012 | A1 | 9/2006 | Yamaguchi et al. | |
| 2007/0001726 | A1* | 1/2007 | Lee | H03K 5/13 327/175 |
| 2009/0128541 | A1 | 5/2009 | Tsai et al. | |
| 2012/0307959 | A1* | 12/2012 | Furuta | G11C 19/184 377/64 |
| 2013/0057161 | A1 | 3/2013 | Azami et al. | |
| 2013/0100006 | A1 | 4/2013 | Lin et al. | |
| 2013/0241812 | A1 | 9/2013 | Fujikawa | |

FOREIGN PATENT DOCUMENTS

| CN | 1326179 | 12/2001 |
| CN | 1835063 | 9/2006 |
| CN | 103280198 | 9/2013 |
| TW | 200923967 | 6/2009 |
| TW | 201317967 | 5/2013 |

\* cited by examiner

*Primary Examiner* — Larry Sternbane
(74) *Attorney, Agent, or Firm* — WPAT, P.C.; Justin King

(57) ABSTRACT

A gate driver includes a plurality of shift registers and a plurality of cutting units. Each of the shift registers is configured for outputting a shift register signal according to a clock signal of the each of the shift register sequentially. Each of the shift register signals has a working period and the two working periods of the two adjacent shift register signals overlap each other. Each of the cutting units is coupled to a respective one of the shift registers. The cutting unit corresponding to the Nth shift register is configured for cutting a part of the working period from the shift register signal of the Nth shift register to generate a gate driving signal according to the clock signal of the (N−1)th or (N+1)th shift register, such that working periods of the gate driving signals are staggered. N is a positive integer larger than two.

15 Claims, 9 Drawing Sheets

DOUBLE SIDED SINGLE DRIVE GATE DRIVER WITH REDUCED DARK SPOTS

RELATED APPLICATIONS

This application claims priority to Taiwan Application Serial Number 102144600, filed Dec. 5, 2013, which is herein incorporated by reference.

BACKGROUND

1. Field of Invention

The present invention relates to a gate driver. More particularly, the present invention relates to gate driver of a display panel.

2. Description of Related Art

In recent years, products utilizing liquid crystal displays have become very popular. Generally speaking, shift registers are disposed on one side of the liquid crystal display. In order to realize the display panel having a narrow bezel, another method for disposing the shift registers has been recently developed, which is called double-sided single-drive circuit architecture.

In a double-sided single-drive circuit architecture, shift registers are disposed on two sides outside the pixel area in the display panel. The shift registers on one side output the gate signals of the even-numbered stage shift registers, and the shift registers on the other side output the gate signals of the odd-numbered stage shift registers. By making full use of the room on the two sides outside the pixel area, the area required by the original layout of the single-sided gate drivers is reduced, thus achieving the narrow bezel.

However, disposing the traditional shift registers in the double-sided single-drive circuit architecture results in the single dark spot originally existing in the liquid crystal display to increase to two dark spots connected to each other. Consequently, the production yield of the liquid crystal display greatly decreases so as to increase the production cost correspondingly.

For the aforementioned reasons, there is a need for solving the above-mentioned problem by providing a gate driver.

SUMMARY

An objective of the present invention is to provide a gate driver to avoid two continuous dark spots being generated when the shift registers are disposed in a double-sided single-drive architecture so as to increase the production yield and reduce the production cost.

A gate driver is provided. The gate driver comprises a plurality of shift registers and a plurality of cutting units. Each of the plurality of shift registers is configured for outputting a shift register signal according to a clock signal of the each of the plurality of shift registers sequentially. Each of the shift register signals has a working period, and the two working periods of the two adjacent shift register signals overlap each other. Each of the plurality of cutting units is coupled to a respective one of the plurality of shift registers. The cutting unit corresponding to an Nth shift register is configured for cutting a part of the working period from the shift register signal of the Nth shift register to generate a gate driving signal according to the clock signal of an (N−1)th shift register or an (N+1)th shift register, such that working periods of the gate driving signals generated by the plurality of cutting units are staggered. N is a positive integer greater than 2.

The invention provides a gate driver. The gate driver comprises a plurality of shift registers and a plurality of control units. Each of the plurality of shift registers comprises a clock shift circuit and an output stage. The clock shift circuit is configured for generating a shift signal according to a clock signal of the each of the plurality of shift registers. The output stage comprises a buffer and a cut-off switch. The cut-off switch is configured for selectively enabling or disabling the buffer according to the clock signal of an (N−1)th shift register, such that the buffer cuts a part of a working period from the shift signal of an Nth shift register so as to generate a shift register signal of the Nth shift register. The plurality of control units are configured for outputting the shift register signals to serve as a plurality of gate driving signals. Working periods of the plurality of gate driving signals are staggered.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
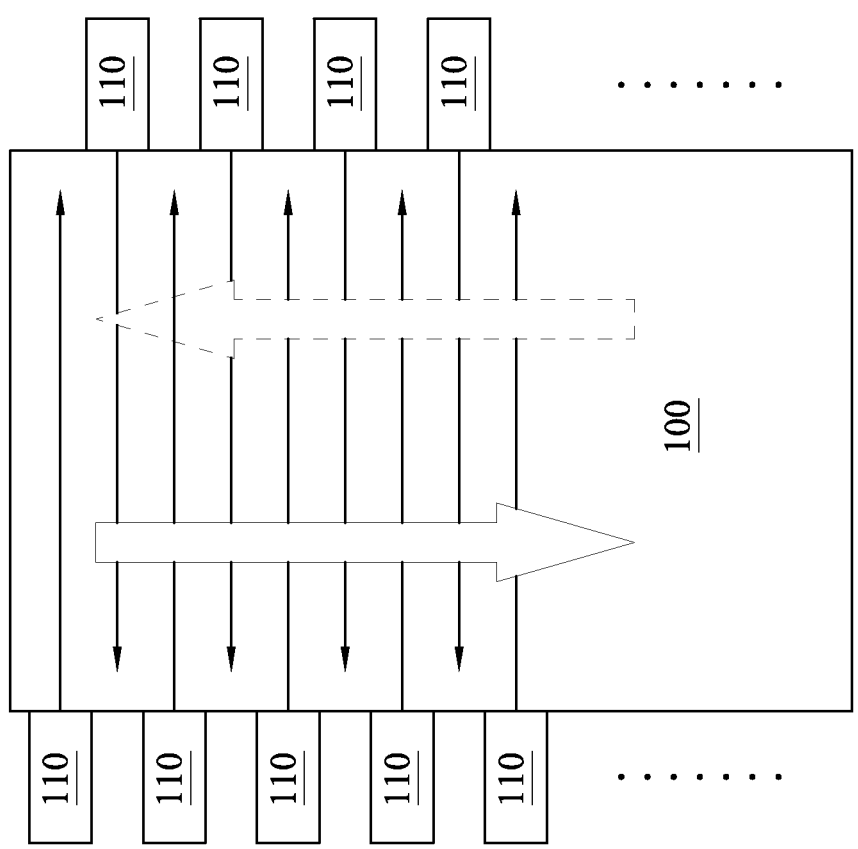
FIG. 1 depicts a schematic diagram of a configuration of an image display area and a gate driver in a display panel according to one embodiment of this invention.

Reference will now be made in detail to the present embodiments of the invention, examples of which are illustrated in the accompanying drawings. However, the embodiments provided herein are intended as illustrative only since numerous modifications and variations therein will be apparent to those skilled in the art. Description of the operation does not intend to limit the operation sequence. Any structures resulting from recombination of components with equivalent effects are within the scope of the present invention. In addition, drawings are only for the purpose of illustration and not plotted according to the original size. Wherever possible, the same reference numbers are used in the drawings and the description to refer to the same or like parts.

Terms used throughout the specification and the claims typically have common meanings for each of the terms used in this field, in the present invention and in special contents, unless specially noted. Some terms for describing the present invention will be discussed in the following or elsewhere in this specification for providing practitioners with additional guidance related to the description of the present invention.

As used herein, "the first", "the second", etc. do not refer to the order or priority, nor are they intended to limit the invention. They are merely used to distinguish the devices or operations described with the same technical terms.

Furthermore, it should be understood that the terms, "comprising", "including", "having", "containing", "involving" and the like, used herein are open-ended, that is, including but not limited to.

As used herein, both "couple" and "connect" refer to direct physical contact or electrical contact or indirect physical contact or electrical contact between two or more components. Alternatively, they can also refer to reciprocal operations or actions between two or more components.

FIG. 1 depicts a schematic diagram of a configuration of an image display area and a gate driver in a display panel according to one embodiment of this invention. As shown in FIG. 1, a gate driver comprises a plurality of driving stages 110. One part of the driving stages 110 are disposed on a right side of an image display area 100, and the other part of the driving stages 110 are disposed on a left side of the image display area 100. The driving stages 110 on the both sides output a gate driving signal alternately so as to transmit the gate driving signals to the image display area 100, that is the double-sided single-drive circuit architecture. In one embodiment, the driving stages 110 on the both sides output the gate driving signal alternately from top to bottom. In another embodiment, the driving stages 110 on the both sides output the gate driving signal alternately from bottom to top.

Figure 2:
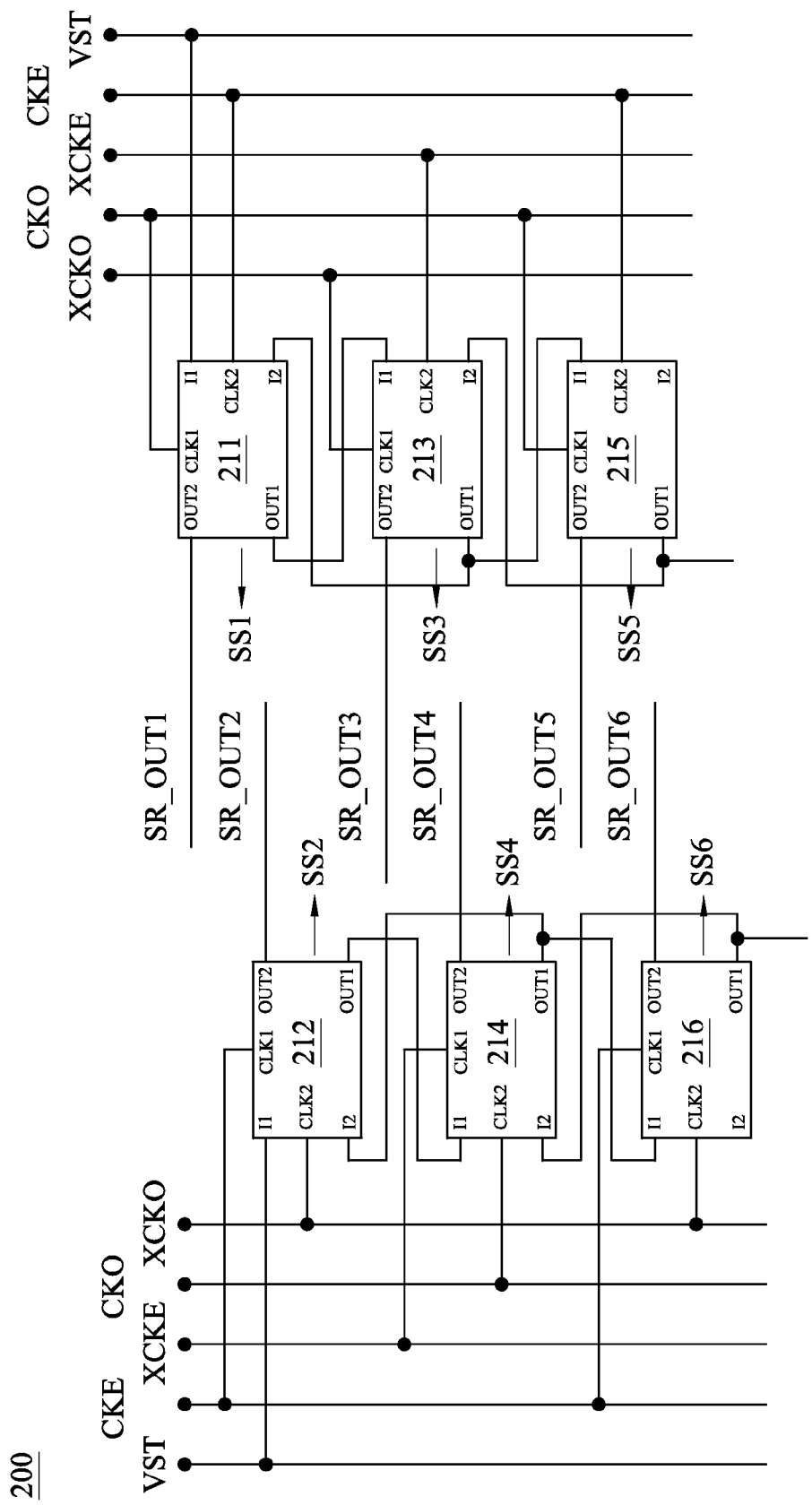
FIG. 2 depicts a schematic diagram of a gate driver according to an embodiment of this invention.

FIG. 2 depicts a schematic diagram of a gate driver according to one embodiment of this invention. A gate driver 200 comprises a plurality of driving stages 211-216. In the embodiment shown in FIG. 2, a sequence of the six driving stages 211-216 are depicted schematically, but the present disclosure is not limited to this. The driving stage 211, the driving stage 213, and the driving stage 215 may be disposed on a right side of an image display area. Conversely, the driving stage 212, the driving stage 214, and the driving stage 216 may be disposed on a left side of the image display area. With such a configuration, a double-sided driver architecture is formed.

Each of the driving stages 211-216 includes a clock input terminal CLK1, a clock input terminal CLK2, an input terminal I1, an input terminal I2, an output terminal OUT1, and an output terminal OUT2.

The clock input terminal CLK1 of each of the driving stages 211-216 is configured for receiving a clock signal (CKO, CKE, XCKO, or XCKE) corresponding to the each of the driving stages 211-216. For example, as shown in FIG. 2, the clock input terminal CLK1 of the driving stage 211 receives the clock signal CKO. The clock input terminal CLK1 of the driving stage 212 receives the clock signal CKE. The clock input terminal CLK1 of the driving stage 213 receives the clock signal XCKO. The clock input terminal CLK1 of the driving stage 214 receives the clock signal XCKE. The clock input terminal CLK1 of the driving stage 215 receives the clock signal CKO. The clock input terminal CLK1 of the driving stage 216 receives the clock signal CKE, and so forth. Waveforms of the clock signals CKO, CKE, XCKO, XCKE are the same, and a difference between the waveforms of two of the adjacent clock signals is a working period.

It is noted that the clock input terminals CLK1 of the odd-numbered driving states 211, 213, 215 are alternately controlled by the clock signal CKO and the clock signal XCKO. The clock input terminals CLK1 of the even-numbered driving states 212, 214, 216 are alternately controlled by the clock signal CKE and the clock signal XCKE.

The clock input terminal CLK2 is configured for receiving the clock signal corresponding to the clock input terminals CLK1 of the next driving stage. For example, in the embodiment shown in FIG. 2, the clock input terminal CLK1 of the driving stage 211 receives the clock signal CKO, and the clock input terminal CLK2 of the driving stage 211 receives the clock signal CKE (that is, the clock signal CKE corresponding to the clock input terminal CLK1 of the next driving stage 212). The clock input terminal CLK1 of the driving stage 212 receives the clock signal CKE, and the clock input terminal CLK2 of the driving stage 212 receives the clock signal XCKO (that is, the clock signal XCKO corresponding to the clock input terminal CLK1 of the next driving stage 213), and so forth.

Similarly, the clock input terminals CLK2 of the odd-numbered driving states 211, 213, 215 are alternately controlled by the clock signal CKE and the clock signal XCKE. The clock input terminals CLK2 of the even-numbered driving states 212, 214, 216 are alternately controlled by the clock signal XCKO and the clock signal CKO.

The output terminals OUT1 of the driving stages 211-216 are respectively configured for outputting shift register signals SS1-SS6. The output terminals OUT2 of the driving stages 211-216 are respectively configured for outputting gate driving signals SR_OUT1-SR_OUT6.

The input terminal I1 and the input terminal I2 of each of the driving stages 211-216 are respectively configured for receiving the shift register signals output by the two adjacent driving stages on the same side. For example, take the odd-numbered driving stages 211, 213 in the embodiment shown in FIG. 2 for example, the input terminal I1 of the driving stage 211 receives a start signal VST, and the input terminal I2 of the driving stage 211 receives the shift register signal SS3 output by the driving stage 213. The input terminal I1 of the driving stage 213 receives the shift register signal SS1 output by the driving stage 211, and the input terminal I2 of the driving stage 213 receives the shift register signal SS5 output by the driving stage 215, and so forth.

With respect to operations of the odd-numbered driving stages 211, 213, 215, the driving stage 211 receives the clock signals CKO, CKE and the start signal VST to allow the driving stage 211 to output the shift register signal SS1 and the gate driving signal SR_OUT1. Then, the driving stage 213 receives the clock signals XCKO, XCKE and the shift register signal SS1 output by the driving stage 211 to allow the driving stage 213 to output the shift register signal SS3 and the gate driving signal SR_OUT3. After that, the driving stage 215 receives the clock signals CKO, CKE and the shift register signal SS3 output by the driving stage 213 to allow the driving stage 215 to output the shift register signal SS5 and the gate driving signal SR_OUT5.

At the same time, the even-numbered driving stages 212, 214, 216 operate in the same manner. The driving stage 212 receives the clock signals CKE, XCKO and the start signal VST to allow the driving stage 212 to output the shift register signal SS2 and the gate driving signal SR_OUT2. Then, the driving stage 214 receives the clock signals XCKE, CKO and the shift register signal SS2 output by the driving stage 212 to allow the driving stage 214 to output the shift register signal SS4 and the gate driving signal SR_OUT4. After that, the driving stage 216 receives the clock signals CKE, XCKO and the shift register signal SS4 output by the driving stage 214 to allow the driving stage 216 to output the shift register signal SS6 and the gate driving signal SR_OUT6.

It is noted that shift register operations of the odd-numbered driving stages 211, 213, 215 are independent of shift register operations of the even-numbered driving stages 212, 214, 216. In other words, the input terminal I1, the input terminal I2, and the output terminal OUT1 of each of the odd-numbered driving stages 211, 213, 215 are only connected to the other odd-numbered driving stages on the same side. The input terminal I1, the input terminal I2, and the output terminal OUT1 of each of the even-numbered driving stages 212, 214, 216 are only connected to the other even-numbered driving stages on the same side. The driving stages 211-216 on the both sides only share the same four clock signals CKO, CKE, XCKO, and XCKE. However, since the odd-numbered driving stages 211, 213, 215 and the even-numbered driving stages 212, 214, 216 operate simultaneously, the gate driving signals SR_OUT1-SR_OUT6 are output to the image display area in sequence.

In the above embodiment, signals that are transmitted from top to bottom serve as an example, that is, the driving stages 211-216 on the both sides output the shift register signals SS1-SS6 and the gate driving signals SR_OUT1-SR_OUT6 alternately from top to bottom. Hence, the shift register signal output from each of the driving stages 211-216 is input to the input terminal I1 of the driving stage two stages ahead the each of the driving stages 211-216. In addition, if the driving stages 211-216 on the both sides output the shift register signals SS1-SS6 and the gate driving signals SR_OUT1-SR_OUT6 alternately from bottom to top, the shift register signal output from each of the driving stages 211-216 is input to the input terminal I2 of the driving stage two stages before the each of the driving stages 211-216.

Figure 3:
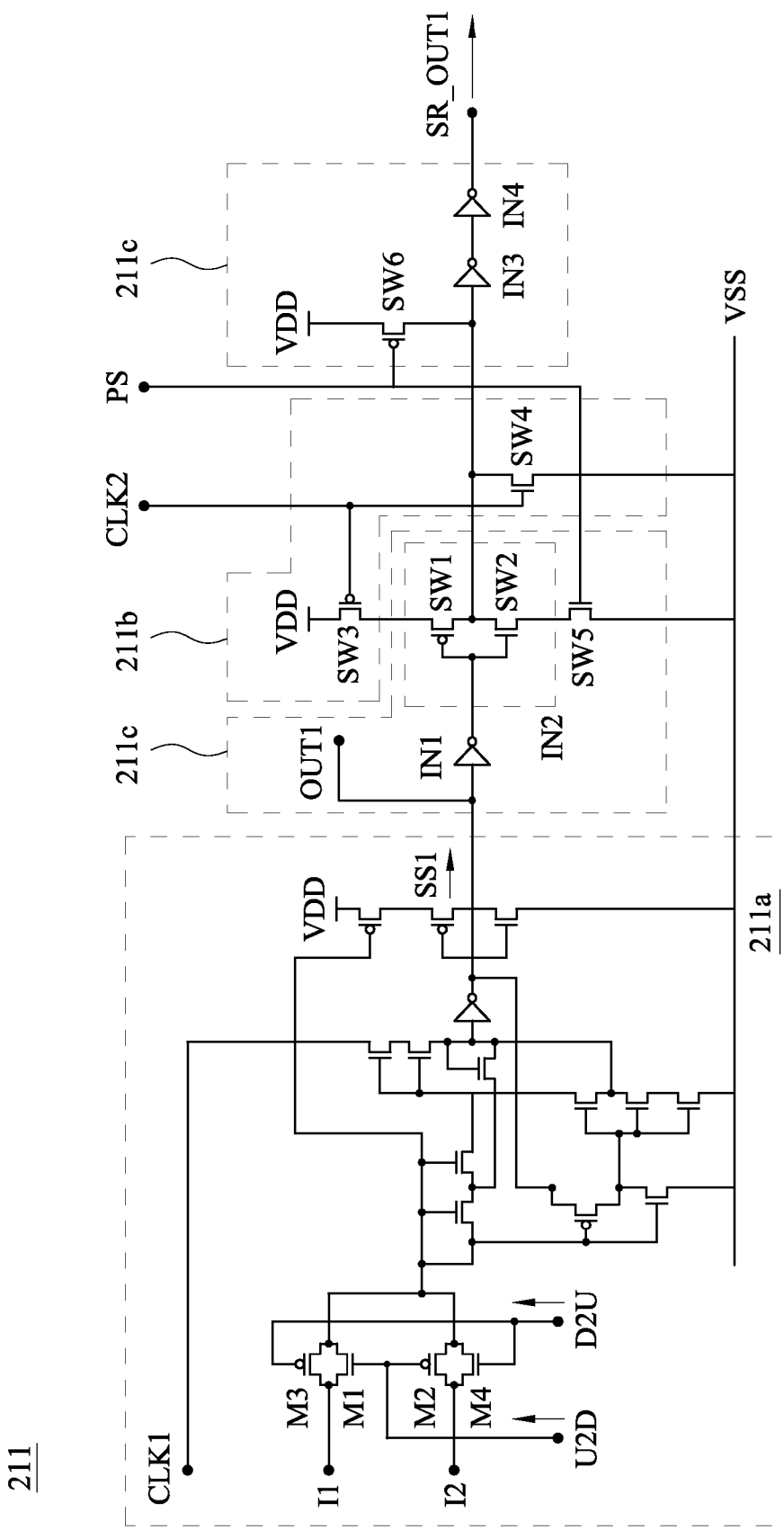
FIG. 3 depicts a schematic diagram of a driving stage of a gate driver shown in FIG. 2 according to an embodiment of this invention.

FIG. 3 depicts a schematic diagram of the driving stage 211 of the gate driver 200 shown in FIG. 2 according to one embodiment of this invention. To simplify matters, the circuit architecture of the driving stage 211 is only depicted schematically in FIG. 3. Actually, each of the driving stages 211-216 shown in FIG. 2 may have an equivalent circuit or a circuit corresponding to the other circuits as the driving stage 211 shown in FIG. 3. As shown in FIG. 3, the driving stage 211 comprises a shift register 211a, a cutting unit 211b, and a control unit 211c.

The shift register 211a is configured for outputting the shift register signal SS1 at the output terminal OUT1 according to the clock signal at the clock input terminal CLK1 and signals at the input terminals I1, I2. The shift register signal SS1 has a high level period, and the high level period is a working period.

It is noted that two working periods of the shift register signals output by the two adjacent driving stages overlap each other.

Additionally, the shift register is further configured for receiving a downward-movement signal U2D and an upward-movement signal D2U so that the shift register signals output from the adjacent driving stages on the same side can be selectively input to the shift register. Take the embodiment shown in FIG. 3 for example, the shift register 211a receives the downward-movement signal U2D and the upward-movement signal D2U so that the start signal VST and the shift register signal SS3 output from the driving stage 213 are selectively input to the shift register 211a.

For example, if the signal is transmitted from top to bottom, the downward-movement signal U2D is at a high voltage level, and the upward-movement signal D2U is at a low voltage level. Under the circumstances, transistors M1, M3 are enabled and transistors M2, M4 are disabled to allow the start signal VST to be input to the shift register 211a, and the shift register signal SS3 output from the next driving stage 213 on the same side is not allowed to be input to the shift register 211a.

It is noted that the driving stage 211 is an initial driving stage. Since the shift register signal of the previous driving stage on the same side is not available for to be input to the input terminal I1 of the driving stage 211, the signal input to the input terminal I1 of the driving stage 211 is set to be the start signal VST.

The control unit 211c comprises a first inverting circuit IN1 and a second inverting circuit IN2. As shown in FIG. 3, the first inverting circuit IN1 is connected to the shift register 211a and configured for inverting the shift register signal SS1 for the first time. The second inverting circuit IN2 is connected to the first inverting circuit IN1 and configured for inverting the shift register signal SS1 for the second time. The second inverting circuit IN2 further comprises a first switch SW1 and a second switch SW2.

The cutting unit 211b is coupled to the shift register 211a through the first and second inverting circuits IN1, IN2. The cutting unit 211b is configured for cutting a part of the working period from the shift register signal SS1 according to the clock signal CKE input from the clock input terminal CLK2 so as to generate the gate driving signal SR_OUT1. Similarly, each of the other driving stages also cut a part of the working period from the respective shift register signal according to the clock signal input from the clock input terminal CLK2 corresponding to the each of the other driving stages so as to generate the gate driving signal correspondingly. As a result, working periods of the gate driving signals SR_OUT1-SR_OUT6 generated by the cutting units of all the driving stages are staggered, thus avoiding two continuous dark spots being generated in the image display area.

When an insulation layer of a capacitor in the display panel has impurities, the pixel signal corresponding to the capacitor as mentioned above and a COM signal connected from a driver integrated circuit (IC) to a scan electrode are shorted. Hence, the pixel signal is pulled down to the voltage level of the COM signal to result in a single dark spot. If the working periods of the gate driving signals overlap each other, the pixel signal will discharge through the adjacent short circuit so as to cause the occurrence of two continuous dark spots. Conversely, if the working periods are staggered, the pixel signal is not able to discharge through the adjacent short circuit, thus avoiding the generation of the two continuous dark spots.

It is noted that the above clock signal input from the clock input terminal CLK2 is the clock signal input from the clock input terminal CLK1 of the next driving stage. For example, as shown in FIG. 3, the clock signal CKE input from the clock input terminal CLK2 of the driving stage 211 is the clock signal CKE input from the clock input terminal CLK1 of the driving stage 212.

In the present embodiment, the cutting unit 211b corresponding to the shift register 211a of the driving stage 211 further comprises a third switch SW3 and a fourth switch SW4. The third switch SW3 includes a first terminal, a second terminal, and a control terminal. The control terminal of the third switch SW3 is configured for receiving the clock signal CKE input from the clock input terminal CLK1 of a shift register of the driving stage 212. The first terminal of the third switch SW3 is electrically connected to a high level voltage VDD. The second terminal of the third switch SW3 is electrically connected to the second inverting circuit IN2. In addition, the fourth switch SW4 includes a first terminal, a second terminal, and a control terminal. The control terminal of the fourth switch SW4 is configured for receiving the clock signal CKE input from the clock input terminal CLK1 of the shift register of the driving stage 212. The first terminal of the fourth switch SW4 is electrically connected to an output terminal of the second inverting circuit IN2. The second terminal of the fourth switch SW4 is electrically connected to a low level voltage VSS.

With respect to the operations, when the clock signal CKE at the clock input terminal CLK2 of the driving stage 211 (that is, the clock signal CKE input from the clock input terminal CLK1 of the shift register of the driving stage 212) is in transience from the low voltage level to the high voltage level, the third switch SW3 is turned off and the fourth switch SW4 is turned on so that the gate driving signal SR_OUT1 of the driving stage 211 is in transience from the high voltage level to the low voltage level. The working periods of the gate driving signals SR_OUT1-SR_OUT6 output from the driving stages 211-216 in the gate driver 200 are thus staggered to avoid the two continuous dark spots being generated in the image display area.

In addition, the control unit 211c further comprises a pull-up unit. The pull-up unit is electrically connected to an output terminal of the cutting unit 211b and is configured for pulling up the gate driving signal SR_OUT1 to the high voltage level according to a power supply signal PS when the power is off. The pull-up unit further comprises a fifth switch SW5 and a sixth switch SW6. The fifth switch SW5 has a first terminal, a second terminal, and a control terminal. The control terminal of the fifth switch SW5 is configured for receiving the power supply signal PS. The first terminal of the fifth switch SW5 is electrically connected to the second inverting circuit IN2. The second terminal of the fifth switch SW5 is electrically connected to the low level voltage VSS. Additionally, the sixth switch SW6 has a first terminal, a second terminal, and a control terminal. The control terminal of the sixth switch SW6 is configured for receiving the power supply signal PS. The first terminal of the sixth switch SW6 is electrically connected to the high level voltage VDD. The second terminal of the sixth switch SW6 is electrically connected to the output terminal of the cutting unit 211b.

With respect to the operations, when the driving stage 211 is in a normal operating state, the power supply signal PS as mentioned above is at the high voltage level. At this time, the fifth switch SW5 is turned on and the sixth switch SW6 is turned off. The second inverting circuit IN2 inverts the shift register signal SS1 for the second time, outputs the shift register signal SS1 to the cutting unit 211b, and then outputs the gate driving signal SR_OUT1 correspondingly. Conversely, when the driving stage 211 is powered off (e.g., the power supply for the display panel is off unexpectedly or is turned off), the power supply signal PS will be in transience to the low voltage level so that the fifth switch SW5 is turned off and the sixth switch SW6 is turned on. At this time, the second inverting circuit IN2 stops operating and the output terminal of the second inverting circuit IN2 is pulled up to the high voltage level through the sixth switch SW6. A high-level signal is thus output to serve as the gate driving signal SR_OUT1, which is provided to the display panel so that the pixel discharges to be restored to its initial state.

The control unit 211c further comprises a third inverting circuit IN3 and a fourth inverting circuit IN4. As shown in FIG. 3, the third inverting circuit IN3 is connected to the second terminal of the sixth switch SW6. An input terminal of the fourth inverting circuit IN4 is connected to an output terminal of the third inverting circuit IN3. With such a configuration, a signal output from the second terminal of the sixth switch SW6 is inverted by the inverting circuits IN3, IN4, and then output to serve as the gate driving signal SR_OUT1.

In practical applications, each of the switches and transistors in the driving stage 211 as mentioned above may be a common P-type transistor, a common N-type transistor, or a thin film transistor (TFT). For example, the switches SW1, SW3, SW6 and the transistors M2, M3 as mentioned above may be P-type transistors, and the switches SW2, SW4, SW5 and the transistors M21 M4 as mentioned above may be N-type transistors.

Figure 4:
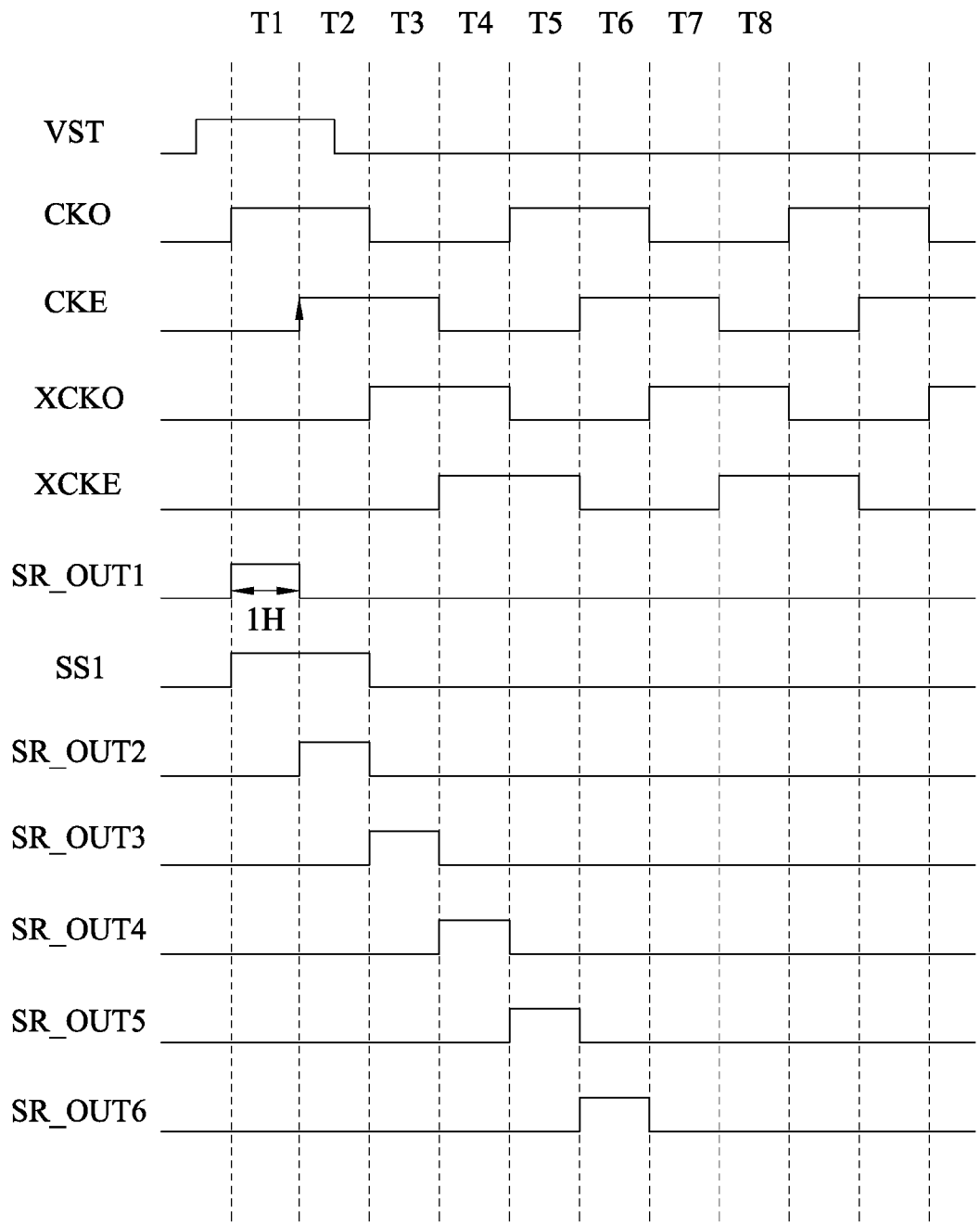
FIG. 4 is a waveform of a gate driver constituted by the driving stage in FIG. 3 according to an embodiment of this invention.

An embodiment is provided for explanation of operations of a gate driver. FIG. 4 is a waveform of a gate driver constituted by the driving stage 211 in FIG. 3 according to one embodiment of this invention. To simplify and clarify matters, a description is provided as follows by way of the gate driver 200 shown in FIG. 2, the single driving stage 211 shown in FIG. 3, and the waveform shown in FIG. 4. It is assumed that the operation of the driving stage 211 in conjunction with the waveform shown in FIG. 4 is a downward-movement scanning operation.

First, during a time interval T1, the driving stage 211 respectively receives the high level clock signal CKO and the start signal VST at the clock input terminal CLK1 and the input terminal I1 so as to output the shift register signal SS1 having the working period. Since the clock input terminal CLK2 of the cutting unit 211b in the driving stage 211 is controlled by the clock signal CKE of the shift register of the driving stage 212, the shift register signal SS1 input to the cutting unit 211b is pulled down to the low voltage level and serves as the gate driving signal SR_OUT1 when the clock signal CKE is in transience to the high voltage level during a time interval T2. As shown in FIG. 4, the shift register signal SS1 of the driving stage 211 is at the high voltage level during the time intervals T1, T2, but the gate driving signal SR_OUT1 is at the high voltage level only during the time interval T1.

Similarly, the clock input terminal CLK2 of the cutting unit in the driving stage 212 is controlled by the clock signal XCKO of a shift register of the driving stage 213. Hence, the shift register signal SS2 input to the cutting unit is pulled down to the low voltage level and serves as the gate driving signal SR_OUT2 when the clock signal XCKO is in transience to the high voltage level during a time interval T3. As shown in FIG. 4, the gate driving signal SR_OUT2 is at the high voltage level only during the time interval T2.

In this manner, as shown in FIG. 4, the gate driving signals SR_OUT3, SR_OUT4, SR_OUT5, SR_OUT6 are respectively at the high voltage level only during the time intervals T3, T4, T5, T6. The working periods of the gate driving signals SR_OUT1-SR_OUT6 are staggered without overlapping, thus avoiding the occurrence of two continuous dark spots effectively.

Figure 5:
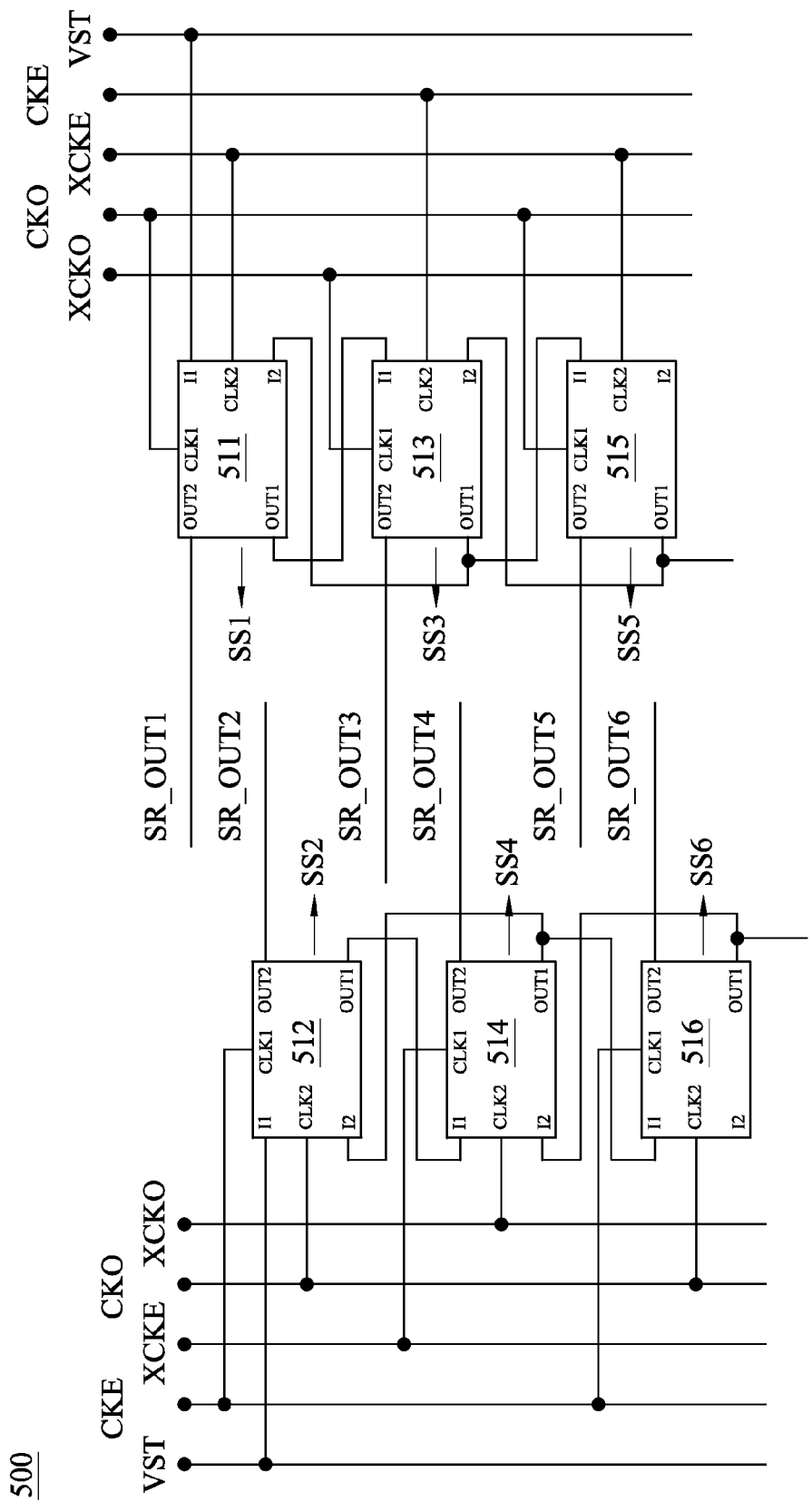
FIG. 5 depicts a schematic diagram of a gate driver according to another embodiment of this invention.

FIG. 5 depicts a schematic diagram of a gate driver according to another embodiment of this invention. The gate driver 500 comprises a plurality of driving stages 511-516. In the embodiment shown in FIG. 5, a sequence of the six driving stages 511-516 are depicted schematically, but the present disclosure is not limited to this. The driving stage 511, the driving stage 513, and the driving stage 515 may be disposed on a right side of an image display area. Conversely, the driving stage 512, the driving stage 514, and the driving stage 516 may be disposed on a left side of the image display area. With such a configuration, a double-sided driver architecture is formed.

Each of the driving stages 511-516 has a clock input terminal CLK1, a clock input terminal CLK2, an input terminal I1, an input terminal I2, an output terminal OUT1, and an output terminal OUT2. Since the connection method of the driving stages 511-516 as mentioned above is similar to that in the gate driver 200 shown in FIG. 2, a description in this regard is not provided.

It is noted that the clock input terminal CLK2 is configured for receiving the clock signal corresponding to the clock input terminals CLK1 of the previous driving stage according to the present embodiment. For example, in the embodiment shown in FIG. 5, the clock input terminal CLK1 of the driving stage 513 receives the clock signal XCKO, and the clock input terminal CLK2 of the driving stage 513 receives the clock signal CKE (that is, the clock signal CKE corresponding to the clock input terminal CLK1 of the previous driving stage 512). The clock input terminal CLK1 of the driving stage 514 receives the clock signal XCKE, and the clock input terminal CLK2 of the driving stage 514 receives the clock signal XCKO (that is, the clock signal XCKO corresponding to the clock input terminal CLK1 of the previous driving stage 513), and so forth.

Similarly, the clock input terminals CLK2 of the odd-numbered driving stages 511, 513, 515 are alternately controlled by the clock signal XCKE and the clock signal CKE. The clock input terminals CLK2 of the even-numbered driving stages 512, 514, 516 are alternately controlled by the clock signal CKO and the clock signal XCKO.

Figure 6:
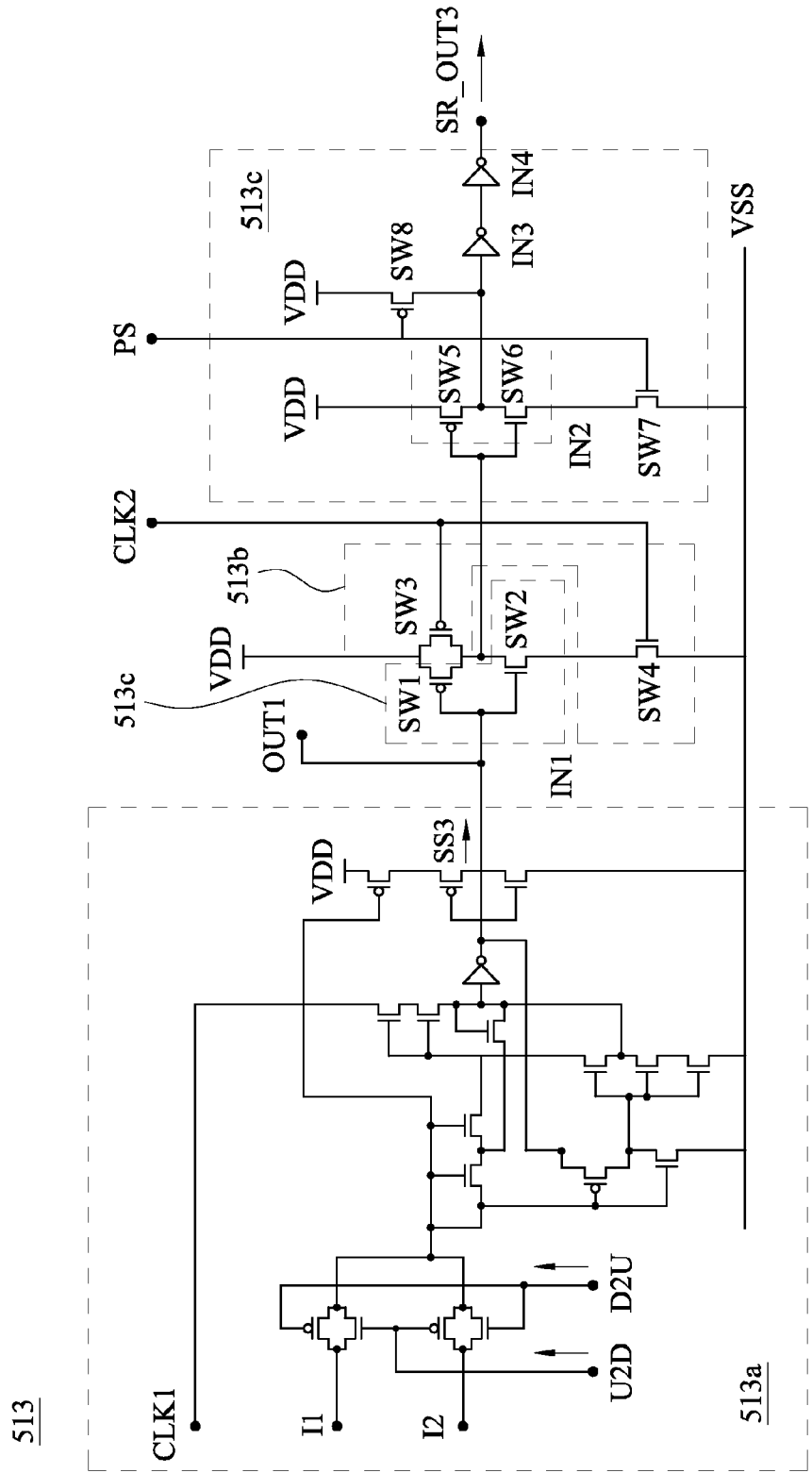
FIG. 6 depicts a schematic diagram of a driving stage of a gate driver shown in FIG. 5 according to another embodiment of this invention.

FIG. 6 depicts a schematic diagram of a driving stage of the gate driver 500 shown in FIG. 5 according to another embodiment of this invention. To simplify matters, the circuit architecture of the driving stage 513 is only depicted schematically in FIG. 6. Actually, each of the driving stages 511-516 shown in FIG. 5 may have an equivalent circuit or a circuit corresponding to the other circuits as the driving stage 513 shown in FIG. 5. As shown in FIG. 6, the driving stage 513 comprises a shift register 513a, a cutting unit 513b, and a control unit 513c.

The shift register 513a is configured for outputting the shift register signal SS3 at the output terminal OUT1 according to the clock signal at the clock input terminal CLK1 and signals at the input terminals I1, I2. The shift register signal SS3 has a high level period, and the high level period is a working period.

It is noted that two working periods of the shift register signals output by the two adjacent driving stages overlap each other.

Additionally, the shift register is further configured for receiving a downward-movement signal U2D and an upward-movement signal D2U so that the shift register signals output from the adjacent driving stages on the same side can be selectively input to the shift register. Take the embodiment shown in FIG. 6 for example, the shift register 513a receives the downward-movement signal U2D and the upward-movement signal D2U so that the shift register signal SS1 output from the driving stage 511 and the shift register signal SS5 output from the driving stage 515 are selectively input to the shift register 513a.

The control unit 513c comprises a first inverting circuit IN1. As shown in FIG. 6, the first inverting circuit IN1 is connected to the shift register 513a and is configured for inverting the shift register signal SS3 for the first time. The first inverting circuit IN1 further comprises a first switch SW1 and a second switch SW2.

The cutting unit 513b is coupled to the shift register 513a through the inverting circuit IN1. The cutting unit 513b is configured for cutting a part of the working period from the shift register signal SS3 according to the clock signal CKE input from the clock input terminal CLK2 so as to generate the gate driving signal SR_OUT3. Similarly, each of the other driving stages also cuts a part of the working period from the respective shift register signal according to the clock signal input from the clock input terminal CLK2 corresponding to the each of the other driving stages so as to generate the gate driving signal correspondingly. As a result, the working periods of the gate driving signals SR_OUT1-SR_OUT6 generated by the cutting units of all the driving stages are staggered.

It is noted that the clock signal as mentioned above input from the clock input terminal CLK2 is the clock signal input from the clock input terminal CLK1 of the previous driving stage. For example, as shown in FIG. 6, the clock signal CKE input from the clock input terminal CLK2 of the driving stage 513 is the clock signal CKE input from the clock input terminal CLK1 of the driving stage 512.

In the present embodiment, the cutting unit 513b corresponding to the shift register 513a of the driving stage 513 further comprises a third switch SW3 and a fourth switch SW4. The third switch SW3 includes a first terminal, a second terminal, and a control terminal. The control terminal of the third switch SW3 is configured for receiving the clock signal CKE input from the clock input terminal CLK1 of a shift register of the driving stage 512. The first terminal of the third switch SW3 is electrically connected to a high level voltage VDD. The second terminal of the third switch SW3 is electrically connected to the first inverting circuit IN1. In addition, the fourth switch SW4 includes a first terminal, a second terminal, and a control terminal. The control terminal of the fourth switch SW4 is configured for receiving the clock signal CKE input from the clock input terminal CLK1 of the shift register of the driving stage 512. The first terminal of the fourth switch SW4 is electrically connected to the first inverting circuit IN1. The second terminal of the fourth switch SW4 is electrically connected to a low level voltage VSS.

With respect to the operations, when the clock signal CKE at the clock input terminal CLK2 of the driving stage 513 (that is, the clock signal CKE input from the clock input terminal CLK1 of the shift register of the driving stage 512) and the shift register signal SS3 are both at a high voltage level, an output terminal of the first inverting circuit IN1 is in transience from the high voltage level to a low voltage level and the gate driving signal SR_OUT3 of the driving stage 513 is in transience from the low voltage level to the high voltage level. In this manner, the working periods of the gate driving signals SR_OUT1-SR_OUT6 output from the driving stages 511-516 in the gate driver 500 are staggered to avoid two continuous dark spots being generated in the image display area.

In addition, the control unit 513c further comprises a second inverting circuit IN2 and a pull-up unit. The second inverting circuit IN2 is connected to the first inverting circuit IN1 through the cutting unit 513b and configured for inverting a signal at the output terminal of the first inverting circuit IN1. The pull-up unit is electrically connected to an output terminal of the second inverting circuit IN2 and is configured for pulling up the gate driving signal SR_OUT3 to the high voltage level according to a power supply signal PS when power is off. The pull-up unit further comprises a seventh switch SW7 and a eighth switch SW8. The seventh switch SW7 includes a first terminal, a second terminal, and a control terminal. The control terminal of the seventh switch SW7 is configured for receiving the power supply signal PS. The first terminal of the seventh switch SW7 is electrically connected to the second inverting circuit IN2. The second terminal of the seventh switch SW7 is electrically connected to the low level voltage VSS. Additionally, the eighth switch SW8 includes a first terminal, a second terminal, and a control terminal. The control terminal of the eighth switch SW8 is configured for receiving the power supply signal PS. The first terminal of the eighth switch SW8 is electrically connected to the high level voltage VDD. The second terminal of the eighth switch SW8 is electrically connected to the output terminal of the second inverting circuit IN2. Since the operation of the pull-up unit is described as above, a description in this regard is not provided.

The control unit 513c further comprises a third inverting circuit IN3 and a fourth inverting circuit IN4. As shown in FIG. 6, the third inverting circuit IN3 is connected to the second terminal of the eighth switch SW8. An input terminal of the fourth inverting circuit IN4 is connected to an output terminal of the third inverting circuit IN3. With such a configuration, a signal output from the second terminal of the eighth switch SW8 is inverted by the inverting circuits IN3, IN4 and then output to serve as the gate driving signal SR_OUT3.

In practical applications, each of the above-mentioned switches in the driving stage 513 may be a common P-type transistor, a common N-type transistor, or a thin film transistor (TFT). For example, the switches SW1, SW3, SW5, SW8 as mentioned above may be P-type transistors, and the switches SW2, SW4, SW6, SW7 as mentioned above may be N-type transistors.

Figure 7:
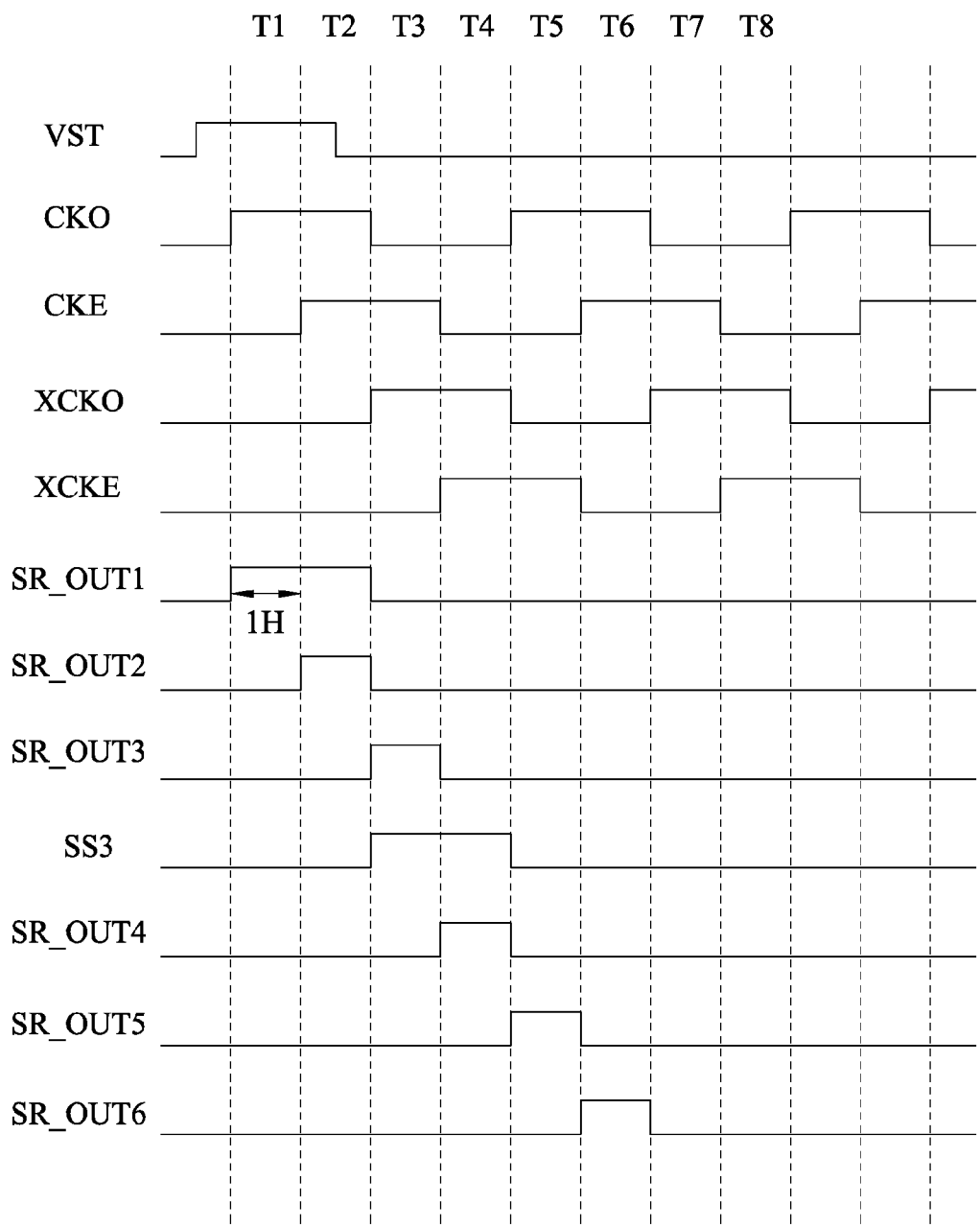
FIG. 7 is a waveform of a gate driver constituted by the driving stage in FIG. 6 according to another embodiment of this invention.

An embodiment is provided for explanation of operations of a gate driver. FIG. 7 is a waveform of a gate driver constituted by the driving stage 513 in FIG. 6 according to another embodiment of this invention. To simplify and clarify matters, a description is provided as follows by way of the gate driver 500 shown in FIG. 5, the single driving stage 513 shown in FIG. 6, and the waveform shown in FIG. 7. It is assumed that the operation of the driving stage 513 in conjunction with the waveform shown in FIG. 7 is a downward-movement scanning operation.

First, during time intervals T1, T2, the driving stage 511 respectively receives the high level clock signal CKO and the start signal VST at the clock input terminal CLK1 and the input terminal I1 so as to output the shift register signal SS1 having a working period. Then, since the clock input terminal CLK2 of a cutting unit is controlled by the clock signal XCKE and the clock signal XCKE is at the low voltage level during the time intervals T1, T2, the shift register signal SS1 of the driving stage 511 is not cut and is output to serve as the gate driving signal SR_OUT1.

During the time interval T2 and a time interval T3, the driving stage 512 respectively receives the high level clock signal CKE and the start signal VST at the clock input terminal CLK1 and the input terminal I1 so as to output the shift register signal SS2 having a working period. The clock input terminal CLK2 of a cutting unit in the driving stage 512 is controlled by the clock signal CKO of a shift register in the driving stage 511. Hence, when the clock signal CKO and the shift register signal SS2 are both at the high voltage level, the output terminal of the inverting circuit IN1 is in transience from the high voltage level to the low voltage level. After the low level signal as mentioned above is inverted by the inverting circuits IN2, IN3, IN4, the high level gate driving signal SR_OUT2 is output. As shown in FIG. 7, during the time interval T2, the clock signal CKO and the shift register signal SS2 are both at the high voltage level so that the gate driving signal SR_OUT2 is also at the high voltage level.

In addition, as shown in FIG. 7, the working periods of the gate driving signals SR_OUT1, SR_OUT2 overlap during the time interval T2. However, since a first driving stage 510 is usually a dummy driving stage, the overlapping of the working periods of the gate driving signals SR_OUT1, SR_OUT2 thus not affects the displayed images too much.

During the time interval T3 and a time interval T4, the driving stage 513 respectively receives the high level clock signal XCKO and the shift register signal SS1 of the driving stage 511 at the clock input terminal CLK1 and the input terminal I1 so as to output the shift register signal SS3 having a working period. The clock input terminal CLK2 of the cutting unit 513b in the driving stage 513 is controlled by the clock signal CKE of the shift register in the driving stage 512. Hence, when the clock signal CKE and the shift register signal SS3 are both at the high voltage level, the output terminal of the inverting circuit IN1 is in transience from the high voltage level to the low voltage level. After the above low level signal is inverted by the inverting circuits IN2, IN3, IN4, the high level gate driving signal SR_OUT3 is output. As shown in FIG. 7, during the time interval T3, the clock signal CKE and the shift register signal SS3 are both at the high voltage level so that the gate driving signal SR_OUT3 is also at the high voltage level.

Similarly, the clock input terminal CLK2 of a cutting unit in the driving stage 514 is controlled by the clock signal XCKO of the shift register 513a of the driving stage 513. Hence, when the clock signal XCKO and the shift register signal SS4 are both at the high voltage level, the output terminal of the inverting circuit IN1 is in transience from the high voltage level to the low voltage level. After the low level signal as mentioned above is inverted by the inverting circuits IN2, IN3, IN4, the high level gate driving signal SR_OUT4 is output. As shown in FIG. 7, the gate driving signal SR_OUT4 is at the high voltage level only during the time interval T4.

In this manner, as shown in FIG. 7, the gate driving signals SR_OUT5, SR_OUT6 are respectively at the high voltage level only during the time intervals T5, T6. The working periods of the gate driving signals SR_OUT1-SR_OUT6 are staggered without overlapping, thus avoiding the occurrence of two continuous dark spots effectively.

Figure 8:
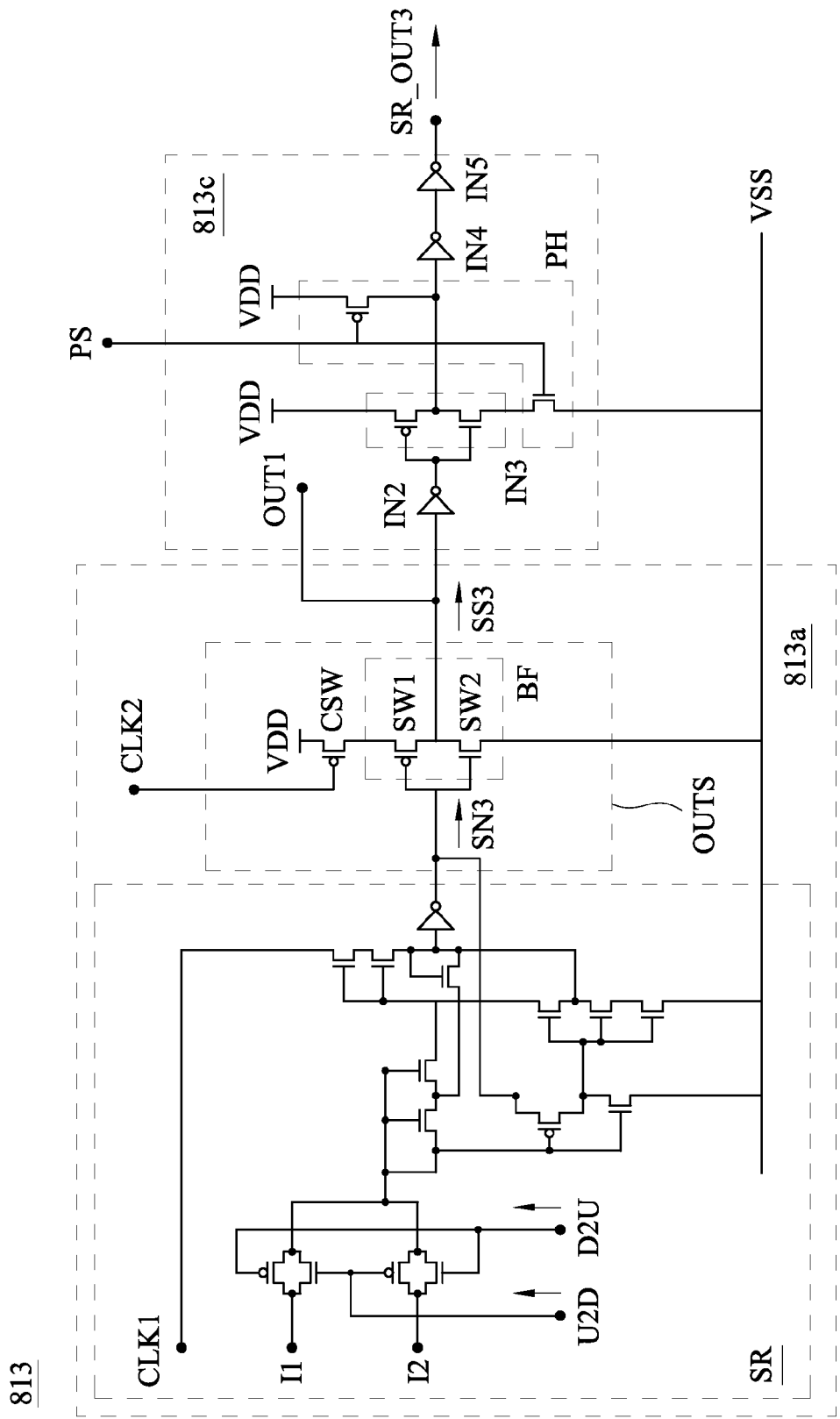
FIG. 8 depicts a schematic diagram of a driving stage of a gate driver according to still another embodiment of this invention.

FIG. 8 depicts a schematic diagram of a driving stage of a gate driver according to still another embodiment of this invention. To simplify matters, the circuit architecture of the driving stage 813 is only depicted schematically in FIG. 8. Actually, each of the driving stages 511-516 shown in FIG. 5 may have an equivalent circuit or a circuit corresponding to the other circuits. As shown in FIG. 8, the driving stage 813 further comprises a shift register 813a and a control unit 813c.

The shift register 813a comprises a clock shift circuit SR and an output stage OUTS. The clock shift circuit SR is configured for generating a shift signal SN3 according to the clock signal XCKO input to the clock input terminal CLK1 of the shift register 813a. The output stage OUTS is configured for receiving the shift signal SN3 and outputting the shift register signal SS3 according to the clock signal CKE input from the clock input terminal CLK2. The output stage OUTS comprise a buffer BF and a cut-off switch CSW.

The cut-off switch CSW is configured for selectively enabling or disabling the buffer BF according to the clock signal CKE input from the clock input terminal CLK2. With such a configuration, the buffer BF is allowed to cut a part of a working period from the shift signal SN3 so as to generate the shift register signal SS3.

It is noted that the clock signal CKE as mentioned above input from the clock input terminal CLK2 of the driving stage 813 is the clock signal CKE input from the clock input terminal CLK1 of the previous driving stage (for example, as shown in FIG. 5, the clock signal CKE input from the clock input terminal CLK2 of the driving stage 513 is the clock signal CKE input from the clock input terminal CLK1 of the driving stage 512).

In addition to that, the cut-off switch CSW includes a first terminal, a second terminal, and a control terminal. The control terminal of the cut-off switch CSW is configured for receiving the clock signal CKE input from the clock input terminal CLK1 of a shift register of the previous driving stage. The first terminal of the cut-off switch CSW is electrically connected to a high level voltage VDD. The second terminal of the cut-off switch CSW is electrically connected to the buffer BF.

The buffer BF comprises a first switch SW1 and a second switch SW2. The first switch SW1 includes a first terminal, a second terminal, and a control terminal. The control terminal of the first switch SW1 receives the shift signal SN3. The first terminal of the first switch SW1 is electrically connected to the cut-off switch CSW. The second terminal of the first switch SW1 is an output terminal of the output stage OUTS. The first switch SW1 is configured for outputting the shift register signal SS3. In addition, the second switch SW2 includes a first terminal, a second terminal, and a control terminal. The control terminal of the second switch SW2 receives the shift signal SN3. The first terminal of the second switch SW2 is electrically connected to the second terminal of the first switch SW1. The second terminal of the second switch SW2 is electrically connected to a low level voltage VSS.

As shown in FIG. 8, the control unit 813c further comprises a second inverting circuit IN2, a third inverting circuit IN3, a fourth inverting circuit IN4, a fifth inverting circuit IN5, and a pull-up unit PH. The second inverting circuit IN2, the third inverting circuit IN3, the fourth inverting circuit 4, and the fifth inverting circuit IN5 respectively invert signals input to the second inverting circuit IN2, the third inverting circuit IN3, the fourth inverting circuit IN 4, and the fifth inverting circuit IN5. The pull-up unit PH is configured for pulling up the gate driving signal SR_OUT3 to a high voltage level according to a power supply signal PS when power is off. Since the operation of the pull-up unit PH is described as above, a description in this regard is not provided. The control unit 813c is configured for inverting the shift register signal SS3 by the second inverting circuit IN2, the third inverting circuit IN3, the fourth inverting circuit IN4, and the fifth inverting circuit IN5, and then re-outputting the processed shift register signal SS3 which serves as the gate driving signal SR_OUT3.

With respect to the operations, when the clock signal CKE at the clock input terminal CLK2 of the driving stage 813 (that is, the clock signal CKE input from the clock input terminal CLK1 of the shift register of the previous driving stage) is in transience from the high voltage level to the low voltage level, the cut-off switch CSW is turned on. The high level voltage VDD is input to the buffer BF through the cut-off switch CSW so that the shift register signal SS3 is in transience from the low voltage level to the high voltage level. As a result, the gate driving signal SR_OUT3 is also in transience from the low voltage level to the high voltage level. In this manner, working periods of the gate driving signals SR_OUT output from the driving stages in the gate driver are staggered to avoid two continuous dark spots being generated in the image display area.

Figure 9:
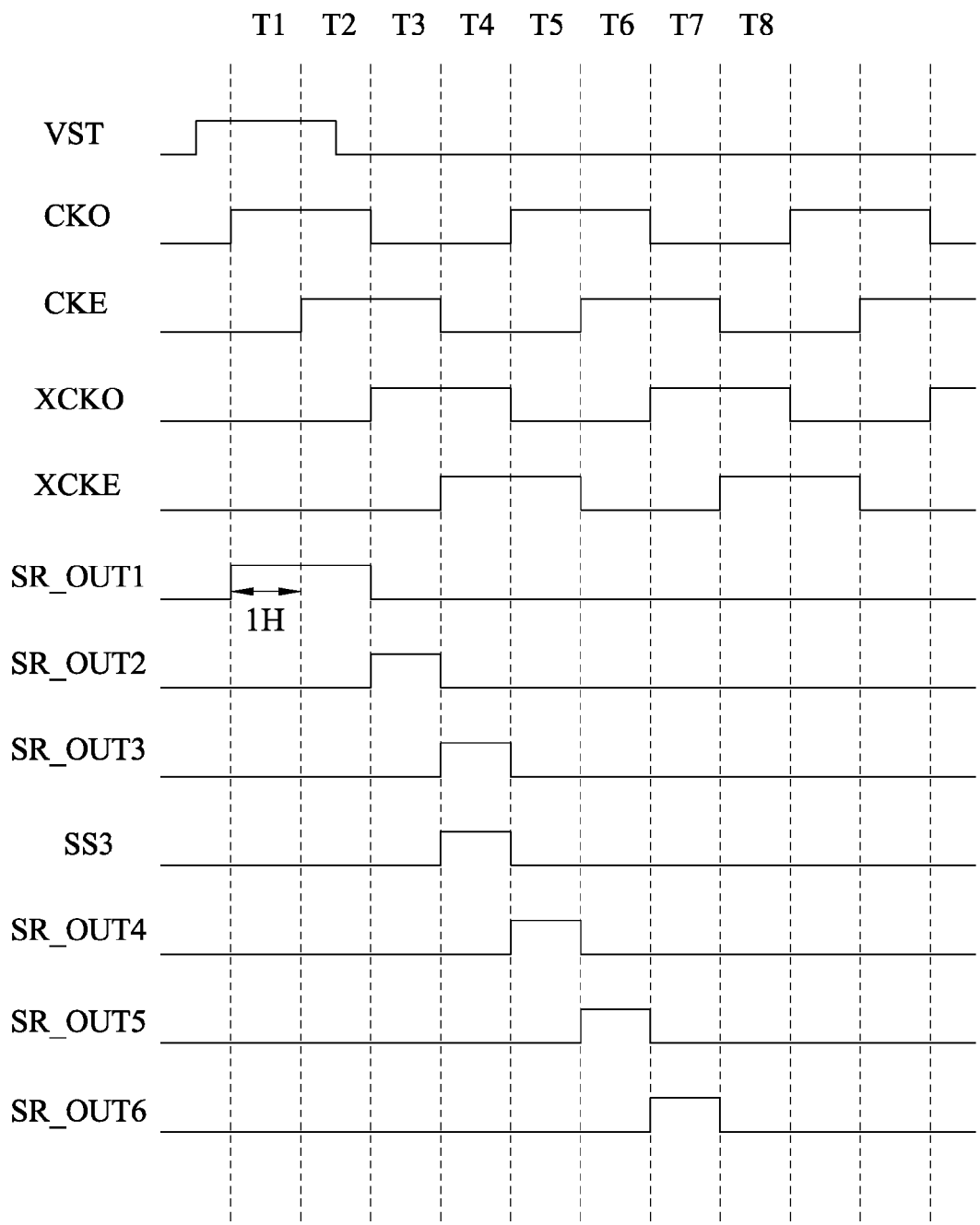
FIG. 9 is a waveform of a gate driver constituted by the driving stage in FIG. 8 according to still another embodiment of this invention.

An embodiment is provided for explanation of operations of a gate driver. FIG. 9 is a waveform of a gate driver constituted by the driving stage 813 in FIG. 8 according to still another embodiment of this invention. To simplify and clarify matters, a description is provided as follows by way of the gate driver 500 shown in FIG. 5, the single driving stage 813 shown in FIG. 8, and the waveform shown in FIG. 9. It is assumed that the operation of the driving stage 813 in conjunction with the waveform shown in FIG. 9 is a downward-movement scanning operation.

During time intervals T3, T4, the driving stage 813 respectively receives the high level clock signal XCKO and the shift register signal of the driving stage two stages before the driving stage 813 at the clock input terminal CLK1 and the input terminal I1 so as to output the shift signal SN3 having a working period. The clock input terminal CLK2 of the cut-off switch CSW in the driving stage 813 is controlled by the clock signal CKE of the shift register in the previous driving stage. Hence, the shift register signal SS3 output from the output stage OUTS is pulled down to the low voltage level and serves as the gate driving signal SR_OUT3 during the time interval T3 in which the clock signal CKE is at the high voltage level. During the time interval T4, the clock signal CKE is in transience to the low voltage level so that the shift register signal SS3 is pulled up to the high voltage level and serves as the gate driving signal SR_OUTS3. As shown in FIG. 9, the shift register signal SS3 and the gate driving signal SR_OUT3 of the driving stage 813 are at the high voltage level only during the time interval T4.

Similarly, the other driving stages in the gate driver output the high level gate driving signals only when the clock signal input from the clock input terminal CLK1 is at the high voltage level and the clock signal input from the clock input terminal CLK2 is at the low voltage level. As shown in FIG. 9, the gate driving signals SR_OUT2-SR_OUT6 are respectively at the high voltage level only during the time intervals T3, T4, T5, T6, T7. The working periods of the gate driving signals SR_OUT2-SR_OUT6 are staggered without overlapping, thus avoiding the occurrence of the two continuous dark spots effectively.

In summary, the working periods of the gate driving signals output from the present invention gate driver are staggered without overlapping so as to effectively avoid the occurrence of the two continuous dark spots in the image display area. As a result, the production yield is greatly increased.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A gate driver comprising:
a plurality of shift registers, each of the plurality of shift registers being configured for outputting a shift register signal and each of the shift register signals having a working period, and two working periods of two adjacent shift register signals overlap each other, wherein an Nth shift register is configured for outputting the shift register signal according to a clock signal of the Nth shift register, a shift register signal generated by an (N−2)th shift register and a shift register signal generated by an (N+2)th shift register; and a plurality of cutting units, each of the plurality of cutting units being coupled to a respective one of the plurality of shift registers, the cutting unit corresponding to an Nth shift register being configured for cutting a part of the working period from the shift register signal of the Nth shift register to generate a gate driving signal according to the clock signal of an (N−1)th shift register or an (N+1)th shift register, such that working periods of the gate driving signals generated by the plurality of cutting units are staggered, where N is a positive integer greater than 2.

2. The gate driver of claim 1, wherein the gate driver further comprises a plurality of control units, each of the plurality of control units is coupled to a respective one of the plurality of shift registers, and each of the plurality of control units comprises:
a first inverting circuit connected to the respective one of the plurality of shift registers and configured for inverting the shift register signal of the one of the plurality of shift registers for a first time; and
a second inverting circuit connected to the first inverting circuit and configured for inverting the shift register signal of the one of the plurality of shift registers for a second time.

3. The gate driver of claim 2, wherein the second inverting circuit further comprises a first switch and a second switch, and the cutting unit corresponding to the Nth shift register further comprises:
a third switch comprising a first terminal, a second terminal, and a control terminal, the control terminal of the third switch being configured for receiving the clock signal of the (N+1)th shift register, the first terminal of the third switch being electrically connected to a high level voltage, and the second terminal of the third switch being electrically connected to the second inverting circuit; and
a fourth switch comprising a first terminal, a second terminal, and a control terminal, the control terminal of the fourth switch being configured for receiving the clock signal of the (N+1)th shift register, the first terminal of the fourth switch being electrically connected to an output terminal of the second inverting circuit, and the second terminal of the fourth switch being electrically connected to a low level voltage.

4. The gate driver of claim 3, wherein when the clock signal of the (N+1)th shift register is in transience from a low voltage level to a high voltage level, the third switch of the cutting unit corresponding to the Nth shift register is turned off and the fourth switch of the cutting unit corresponding to the Nth shift register is turned on so that the gate driving signal of the Nth shift register is in transience from the high voltage level to the low voltage level.

5. The gate driver of claim 3, wherein each of the plurality of control units comprises:
a pull-up unit electrically connected to an output terminal of the cutting unit corresponding to the Nth shift register and configured for pulling up the gate driving signal of the Nth shift register to a high voltage level according to a power supply signal when power is off.

6. The gate driver of claim 5, wherein each of the pull-up units comprises:
a fifth switch comprising a first terminal, a second terminal, and a control terminal, the control terminal of the fifth switch being configured for receiving the power supply signal, the first terminal of the fifth switch being electrically connected to the second inverting circuit, and the second terminal of the fifth switch being electrically connected to the low level voltage; and
a sixth switch comprising a first terminal, a second terminal, and a control terminal, the control terminal of the sixth switch being configured for receiving the power supply signal, the first terminal of the sixth switch being electrically connected to the high level voltage, and the second terminal of the sixth switch being electrically connected to the output terminal of the cutting unit.

7. The gate driver of claim 1, wherein the gate driver further comprises a plurality of control units, each of the plurality of control units is respectively coupled to one of the plurality of shift registers, each of the plurality of control units comprises:
a first inverting circuit respectively connected to the one of the plurality of shift registers and configured for respectively inverting the shift register signal of the one of the plurality of shift registers a first time.

8. The gate driver of claim 7, wherein the first inverting circuit further comprises a first switch and a second switch, the cutting unit corresponding to the Nth shift register further comprises:
a third switch comprising a first terminal, a second terminal, and a control terminal, the control terminal of the third switch being configured for receiving the clock signal of the (N−1)th shift register, the first terminal of the third switch being electrically connected to a high level voltage, and the second terminal of the third switch being electrically connected to the first inverting circuit; and
a fourth switch comprising a first terminal, a second terminal, and a control terminal, the control terminal of the fourth switch being configured for receiving the clock signal of the (N−1)th shift register, the first terminal of the fourth switch being electrically connected to the first inverting circuit, and the second terminal of the fourth switch being electrically connected to a low level voltage.

9. The gate driver of claim 8, wherein when the clock signal of the (N−1)th shift register and the shift register signal of the Nth shift register are both at a high voltage level, an output terminal of the first inverting circuit is in transience from the high voltage level to a low voltage level so that the gate driving signal of the Nth shift register is at the high voltage level.

10. The gate driver of claim 8, wherein each of the plurality of control units further comprises:
a second inverting circuit connected to the first inverting circuit and configured for inverting a signal at the output terminal of the first inverting circuit; and
a pull-up unit electrically connected to an output terminal of the second inverting circuit and configured for pulling up the gate driving signal of the Nth shift register to a high voltage level according to a power supply signal when power is off.

11. The gate driver of claim 10, wherein each of the pull-up units further comprises:
a seventh switch comprising a first terminal, a second terminal, and a control terminal, the control terminal of the seventh switch being configured for receiving the power supply signal, the first terminal of the seventh switch being electrically connected to the second inverting circuit, and the second terminal of the seventh switch being electrically connected to the low level voltage; and
an eighth switch comprising a first terminal, a second terminal, and a control terminal, the control terminal of the eighth switch being configured for receiving the power supply signal, the first terminal of the eighth switch being electrically connected to the high level voltage, and the second terminal of the eighth switch being electrically connected to the output terminal of the second inverting circuit.

12. A gate driver comprising:
a plurality of shift registers, each of the plurality of shift registers comprising:
   a clock shift circuit for generating a shift signal, wherein the clock shift circuit of an Nth shift register is configured for outputting a shift register signal according to a clock signal of the Nth shift register, a shift register signal generated by an (N−2)th shift register and a shift register signal generated by an (N+2)th shift register; and
   an output stage comprising a buffer and a cut-off switch, the cut-off switch corresponding to an Nth shift register being configured for selectively enabling or disabling the buffer according to the clock signal of an (N−1)th shift register, such that the buffer cuts a part of a working period from the shift signal of the Nth shift register so as to generate a shift register signal of the Nth shift register, where N is a positive integer greater than 2; and
a plurality of control units configured for outputting the shift register signals to serve as a plurality of gate driving signals, working periods of the plurality of gate driving signals are staggered.

13. The gate driver of claim 12, wherein the cut-off switch corresponding to the Nth shift register comprises a first terminal, a second terminal, and a control terminal, the control terminal of the cut-off switch corresponding to the Nth shift register is configured for receiving the clock signal of the (N−1)th shift register, the first terminal of the cut-off switch corresponding to the Nth shift register is electrically connected to a high level voltage.

14. The gate driver of claim 13, wherein the buffer corresponding to the Nth shift register further comprises:
   a first switch comprising a first terminal, a second terminal, and a control terminal, the control terminal of the first switch receiving the shift signal of the Nth shift register, the first terminal of the first switch being electrically connected to the cut-off switch corresponding to the Nth shift register, and the second terminal of the first switch being an output terminal of the output stage corresponding to the Nth shift register and configured for outputting the shift register signal of the Nth shift register; and
   a second switch comprising a first terminal, a second terminal, and a control terminal, the control terminal of the second switch receiving the shift signal of the Nth shift register, the first terminal of the second switch being electrically connected to the second terminal of the first switch, and the second terminal of the second switch being electrically connected to a low level voltage.

15. The gate driver of claim 14, wherein when the clock signal of the (N−1)th shift register drops from a high voltage level to a low voltage level, the cut-off switch corresponding to the Nth shift register is turned on to allow the high level voltage to be input to the buffer corresponding to the Nth shift register through the cut-off switch corresponding to the Nth shift register so that the gate driving signal of the Nth shift register rises from the low voltage level to the high voltage level.

* * * * *